(12) United States Patent
Rodnick et al.

(10) Patent No.: US 9,269,529 B2
(45) Date of Patent: Feb. 23, 2016

(54) SYSTEMS AND METHODS FOR DYNAMIC ALIGNMENT BEAM CALIBRATION

(75) Inventors: Matt Rodnick, San Jose, CA (US);
Christine Allen-Blanchette, Oakland, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 896 days.

(21) Appl. No.: 12/810,777

(22) PCT Filed: Dec. 19, 2008

(86) PCT No.: PCT/US2008/087684
§ 371 (c)(1), (2), (4) Date: Jun. 25, 2010

(87) PCT Pub. No.: WO2009/086109
PCT Pub. Date: Jul. 9, 2009

(65) Prior Publication Data
US 2010/0272347 A1   Oct. 28, 2010

Related U.S. Application Data

(60) Provisional application No. 61/017,146, filed on Dec. 27, 2007, provisional application No. 61/017,147, filed on Dec. 27, 2007.

(51) Int. Cl.
*H01J 37/20* (2006.01)
*H01J 37/32* (2006.01)
*H01L 21/68* (2006.01)

(52) U.S. Cl.
CPC ........... *H01J 37/20* (2013.01); *H01J 37/32743* (2013.01); *H01L 21/681* (2013.01); *H01J 2237/2482* (2013.01)

(58) Field of Classification Search
CPC ............... H01J 37/20; H01J 37/32743; H01J 2237/2482; H01L 21/681
See application file for complete search history.

(56) References Cited

U.S. PATENT DOCUMENTS

| 4,055,376 A | 10/1977 | Daberko |
| 4,819,167 A | 4/1989 | Cheng et al. |

(Continued)

FOREIGN PATENT DOCUMENTS

| CA | 2305919 | 10/2000 |
| EP | 0462596 | 6/1991 |

(Continued)

OTHER PUBLICATIONS

"International Preliminary Report on Patentability", Issued in PCT Application No. PCT/US2008/087556; Mailing Date: Jul. 8, 2010.

(Continued)

*Primary Examiner* — Ryan Zeender
*Assistant Examiner* — H Rojas
(74) *Attorney, Agent, or Firm* — Buchanan, Ingersoll & Rooney PC

(57) ABSTRACT

A method for performing DA (Dynamic Alignment) beam calibration in a plasma processing system is provided. The method including acquiring a positional difference, the positional difference is acquired using an optical imaging approach. The optical imaging approach comprising of positioning the wafer on the end effector, taking a still image of the wafer on the end effector, processing the still image to ascertain the center of the wafer and an end effector-defined center defined by the end effector, and determining the positional difference between the center of the wafer and the end effector-defined center defined by the end effector. The method also includes centering a wafer with respect to an end effector by compensating for a positional difference between the wafer and the end effector with robot movement compensation. The method including moving the wafer and the end effector through DA beams associated with a plasma processing module. The method also includes obtaining a reference DA beam pattern by recording a break-and-make pattern of the DA beams. The break-and-make pattern occurring as the wafer and the end effector move through the DA beams.

12 Claims, 3 Drawing Sheets

(56) References Cited

U.S. PATENT DOCUMENTS

| | | | |
|---|---|---|---|
| 4,971,443 | A | 11/1990 | Koyagi |
| 5,530,548 | A | 6/1996 | Campbell et al. |
| 5,675,407 | A | 10/1997 | Geng |
| 5,822,213 | A | 10/1998 | Huynh |
| 5,999,268 | A | 12/1999 | Yonezawa et al. |
| 6,094,264 | A | 7/2000 | Wuyts |
| 6,114,705 | A | 9/2000 | Leavitt et al. |
| 6,126,382 | A | 10/2000 | Scales et al. |
| 6,188,323 | B1 | 2/2001 | Rosenquist et al. |
| 6,191,851 | B1 | 2/2001 | Kirkham et al. |
| 6,195,619 | B1 | 2/2001 | Ren |
| 6,339,730 | B1 | 1/2002 | Matsushima |
| 6,409,463 | B1 * | 6/2002 | Croft et al. ............ 414/754 |
| 6,502,054 | B1 | 12/2002 | Mooring et al. |
| 6,629,053 | B1 | 9/2003 | Mooring |
| 6,747,746 | B2 | 6/2004 | Chizhov et al. |
| 6,895,831 | B2 | 5/2005 | Hunter |
| 6,917,698 | B2 | 7/2005 | Obi |
| 6,952,255 | B2 | 10/2005 | Perry et al. |
| 7,158,280 | B2 | 1/2007 | Sandstrom |
| 7,197,828 | B2 | 4/2007 | Lof et al. |
| 7,352,440 | B2 | 4/2008 | Hoogendam et al. |
| 8,099,192 | B2 | 1/2012 | Genetti et al. |
| 2002/0068992 | A1 | 6/2002 | Hine et al. |
| 2003/0231950 | A1 | 12/2003 | Raaijmakers |
| 2004/0167743 | A1 | 8/2004 | Hosek |
| 2004/0258514 | A1 * | 12/2004 | Raaijmakers ............ 414/935 |
| 2005/0102064 | A1 | 5/2005 | Donoso et al. |
| 2005/0137751 | A1 | 6/2005 | Cox et al. |
| 2005/0276920 | A1 | 12/2005 | Kim |
| 2006/0009047 | A1 | 1/2006 | Wirth et al. |
| 2006/0045666 | A1 | 3/2006 | Harris et al. |
| 2006/0167583 | A1 * | 7/2006 | Sundar ............ 700/218 |
| 2007/0112465 | A1 | 5/2007 | Sadighi et al. |
| 2007/0177963 | A1 | 8/2007 | Tang et al. |
| 2008/0061255 | A1 | 3/2008 | Park |

FOREIGN PATENT DOCUMENTS

| | | | |
|---|---|---|---|
| EP | 1 175 970 | A2 | 1/2002 |
| EP | 1669808 | | 6/2006 |
| JP | 2000-114347 | A | 4/2000 |
| JP | 2001-230302 | A | 8/2001 |
| JP | 2002-313872 | A | 10/2002 |
| JP | 2004-050306 | A | 2/2004 |
| JP | 2004-080001 | A | 3/2004 |
| JP | 2004-288792 | A | 10/2004 |
| KR | 2005-0010849 | A | 1/2005 |
| KR | 1020050087361 | | 8/2005 |
| WO | WO-97-37376 | A1 | 10/1997 |
| WO | WO-99-02996 | A2 | 1/1999 |
| WO | WO-01/78114 | | 10/2001 |
| WO | WO-03/087436 | | 10/2003 |
| WO | WO-2004-086465 | A2 | 10/2004 |
| WO | WO-2005-037495 | A1 | 4/2005 |

OTHER PUBLICATIONS

"International Search Report", Issued in PCT Application No. PCT/US2008/087556; Mailing Date: Aug. 7, 2009.

"Written Opinion", Issued in PCT Application No. PCT/US2008/087556; Mailing Date: Aug. 7, 2009.

"International Search Report", Issued in PCT Application No. PCT/US2008/087684; Mailing Date: Jul. 29, 2009.

"Written Opinion", Issued in PCT Application No. PCT/US2008/087684; Mailing Date: Jul. 29, 2009.

"International Preliminary Report on Patentability", Issued in PCT Application No. PCT/US2008/087684; Mailing Date: Jul. 8, 2010.

"International Search Report", Issued in PCT Application No. PCT/US2008/087775; Mailing Date: Aug. 5, 2009.

"Written Opinion", Issued in PCT Application No. PCT/US2008/087775; Mailing Date: Aug. 5, 2009.

"International Preliminary Report on Patentability", Issued in PCT Application No. PCT/US2008/087775; Mailing Date: Jul. 8, 2010.

"International Search Report", Issued in PCT Application No. PCT/US2008/087578; Mailing Date: Aug. 5, 2009.

"Written Opinion", Issued in PCT Application No. PCT/US2008/087578; Mailing Date: Aug. 5, 2009.

"International Preliminary Report on Patentability", Issued in PCT Application No. PCT/US2008/087578; Mailing Date: Jul. 8, 2010.

"Hungarian Examination Report", Singapore Patent Application No. 201009526-8, Mailing Date: Dec. 2, 2011.

"Hungarian Search Report", Singapore Patent Application No. 201009526-8, Mailing Date: Dec. 2, 2011.

"Hungarian Examination Report", Singapore Patent Application No. 201004301-6, Mailing Date: Dec. 2, 2011.

"Hungarian Search Report", Singapore Patent Application No. 201004301-6, Mailing Date: Dec. 2, 2011.

"Hungarian Examination Report", Singapore Patent Application No. 201004262-0, Mailing Date: Dec. 16, 2011.

"Non Final Office Action", U.S. Appl. No. 12/810,780, Mailing Date: May 24, 2012.

"Non Final Office Action", U.S. Appl. No. 12/810,790, Mailing Date: Sep. 20, 2012.

"Final Office Action", U.S. Appl. No. 12/810,790, Mailing Date: Apr. 1, 2013.

* cited by examiner

SYSTEMS AND METHODS FOR DYNAMIC ALIGNMENT BEAM CALIBRATION

PRIORITY CLAIM

This application is related to and claims priority under 35 U.S.C. §119(e) to a commonly assigned provisional patent application entitled "Optical Technique for Dynamic Alignment Beam Calibration," by Allen-Blanchette et al., Application Ser. No. 61/017,147 filed on Dec. 27, 2007, and under 35 U.S.C. 371 to a PCT Application No. PCT/US2008/087684, filed on Dec. 19, 2008, all of which are incorporated herein by reference.

BACKGROUND OF THE INVENTION

In the processing of semiconductor substrates (e.g., wafers), plasma is often employed. In plasma processing, the wafers are processed using a plasma processing system, which typically includes a plurality of processing modules. The substrate (e.g., wafer) is disposed on a chuck inside a processing module during plasma processing.

In order to move a wafer in and out of the processing module, the wafer is typically placed on an end effector and transferred onto the chuck. The end effector is a structural component configured for supporting the wafer during wafer transfer. The end effector is typically disposed on a robot arm. FIG. 1 shows a representative prior art end effector 102 for supporting a wafer 104 during wafer transfer. For illustration purposes, a portion of a robot arm 106 is also shown.

Generally speaking, during a wafer transfer sequence, the robot arm first moves the end effector to pick up the wafer from a wafer storage cassette or station. Once the wafer is positioned on the end effector, the robot arm would then move the wafer into the plasma processing module through a door in the processing module. The robot arm then positions the end effector and the wafer over the chuck and then places the wafer on the chuck for plasma processing.

In order to ensure that the wafer is processed properly (thereby ensuring controllable and repeatable process results); the wafer needs to be centered on the chuck during plasma processing. If the end effector is correctly centered relative to the chuck and the wafer is correctly centered relative to the end effector, then the wafer would be correctly centered relative the chuck when the robot arm places the wafer on the chuck. However, for many reasons, some of which are discussed below, this ideal scenario is rarely the case.

Due to machining and/or manufacturing tolerances between the various components of the processing chamber, it is possible that the center defined by the end effector (herein referred to as the "end effector center" or the "end effector-defined center") is slightly offset relative to the center of the chuck in a given processing module. As a result, it is possible that the center defined by the end effector may not be correctly aligned with the center of the chuck at the robot arm position that the robot controller deems to be the correct position for wafer placement. If this end effector/chuck mis-alignment is not compensated for during production, the wafer may be inaccurately placed relative to the chuck center during wafer processing. In a co-pending patent application entitled "SYSTEMS AND METHODS FOR CALIBRATING END EFFECTOR ALIGNMENT IN A PLASMA PROCESSING SYSTEM," Ser. No. 12/810,776, filed on even date herewith by the inventors herein and incorporated herein by reference, techniques have been proposed to address this end effector/chuck mis-alignment.

However, even if the end effector center is correctly aligned with the chuck center (or can be made to achieve the effect of a correct alignment), there exists another potential source of error that may result in wafer/chuck mis-alignment during production. That is, different production wafers may be positioned on the end effector differently. If the end effector center is not correctly or consistently aligned with the center of the wafers, wafer/chuck mis-alignment may still occur during production. In this case, even though the end effector center is correctly aligned with the chuck center, the wafer/end effector mis-alignment will cause the wafer to be offset relative to the chuck when the end effector deposits the wafer on the chuck for processing.

Unlike the end effector/chuck misalignment problem, which tends to be a consistent error for all wafers in a given processing module since that alignment error arises from chamber component tolerances and robot calibration issues, the wafer/end-effector mis-alignment may vary with each production wafer. In other words, each production wafer may be positioned on the end effector differently, resulting in differences in the mis-alignment. Accordingly, the solution to address such end effector/wafer misalignment requires a dynamic approach, i.e., one that can adjust for the error of each individual production wafer relative to the end effector during production.

In the prior art, the end effector/wafer mis-alignment is addressed using a dynamic alignment beam approach. A dynamic alignment (DA) beam detection system typically employs two beams (i.e. laser beams) located at the entrance of the plasma processing module door. As the wafer moves through the DA beams (with the beams being orthogonal to the wafer translation plane), the DA beams are broken as the wafer enters the beam, and then resumed at the point where the wafer is no longer present. This pattern of beam signal break-then-make generates a production DA beam pattern.

In the dynamic alignment beam approach, it is necessary to obtain a reference DA beam pattern, i.e., the DA beam pattern that is generated when a wafer that is correctly centered on the end effector moves through the DA beams. By comparing the production DA beam pattern (i.e., the beam pattern obtained for a production wafer) with the reference DA beam pattern, an error vector may be obtained. The robot controller can them move the robot arm by the requisite amount to correct for the end effector/wafer mis-alignment during production. Further information regarding dynamic alignment beams may be found in, for example, issued U.S. Pat. Nos. 6,502,054 and 6,629,053, incorporated herein by reference.

The process of obtaining a reference DA beam pattern is referred to herein as DA beam calibration. In order to calibrate the DA beams, it is necessary then to acquire or obtain a DA beam calibration assembly that includes a wafer correctly centered on the end effector and to move that DA beam calibration assembly through the DA beams so a reference DA beam pattern can be acquired.

In the prior art, the DA beam calibration assembly is obtained using a fabricated disk, which simulates a wafer. The disk has a downward protruding flange that fits on a notch of the end effector (such as notch (not shown) of end effector 102 in FIG. 1). Once the disk is fitted to the notch of the end effector, this combination simulates a correctly centered wafer with respect to end effector. The combination of simulated wafer/end effector is then moved by the robot arm into the processing module in a straight line trajectory path toward the chuck through the DA beams in order to obtain a reference DA beam pattern.

However, there are disadvantages with the prior art technique of using a wafer-simulating disk to create a calibration assembly for the purpose of obtaining a reference DA beam pattern. First of all, attaching a physical mechanical fixture (such as the wafer-simulating disk) on the end effector may potentially damage the end effector.

Additionally, if this calibration is done in the field after some plasma cycles have been executed in the processing module, the placement of a physical or mechanical fixture on the end effector may cause deposited particles on or near the end effector to flake off into the processing module. During the subsequent processing cycles, such particles constitute particle contamination, which is undesirable.

Additionally, because the calibration is performed at atmospheric pressure, the prior art calibration technique may not effectively duplicate the conditions that exist during production. This is because during production, components of the processing module may be placed under vacuum, causing one or more components to shift due to the differential in pressures between the vacuum environment and the ambient atmosphere. Since the calibration conditions do not faithfully duplicate the production conditions, accurate calibration may not be possible. If the calibration process is inaccurate, inaccurate wafer placement during production may occur, leading to decreased yield and an increase in the product rejection and/or failure rate.

SUMMARY OF INVENTION

The invention relates, in an embodiment, a method for performing DA (Dynamic Alignment) beam calibration in a plasma processing system. The method including acquiring a positional difference, the positional difference is acquired using an optical imaging approach. The optical imaging approach comprising of positioning the wafer on the end effector, taking a still image of the wafer on the end effector, processing the still image to ascertain the center of the wafer and an end effector-defined center defined by the end effector, and determining the positional difference between the center of the wafer and the end effector-defined center defined by the end effector. The method also includes centering a wafer with respect to an end effector by compensating for a positional difference between the wafer and the end effector with robot movement compensation. The method including moving the wafer and the end effector through DA beams associated with a plasma processing module. The method also includes obtaining a reference DA beam pattern by recording a break-and-make pattern of the DA beams. The break-and-make pattern occurring as the wafer and the end effector move through the DA beams.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
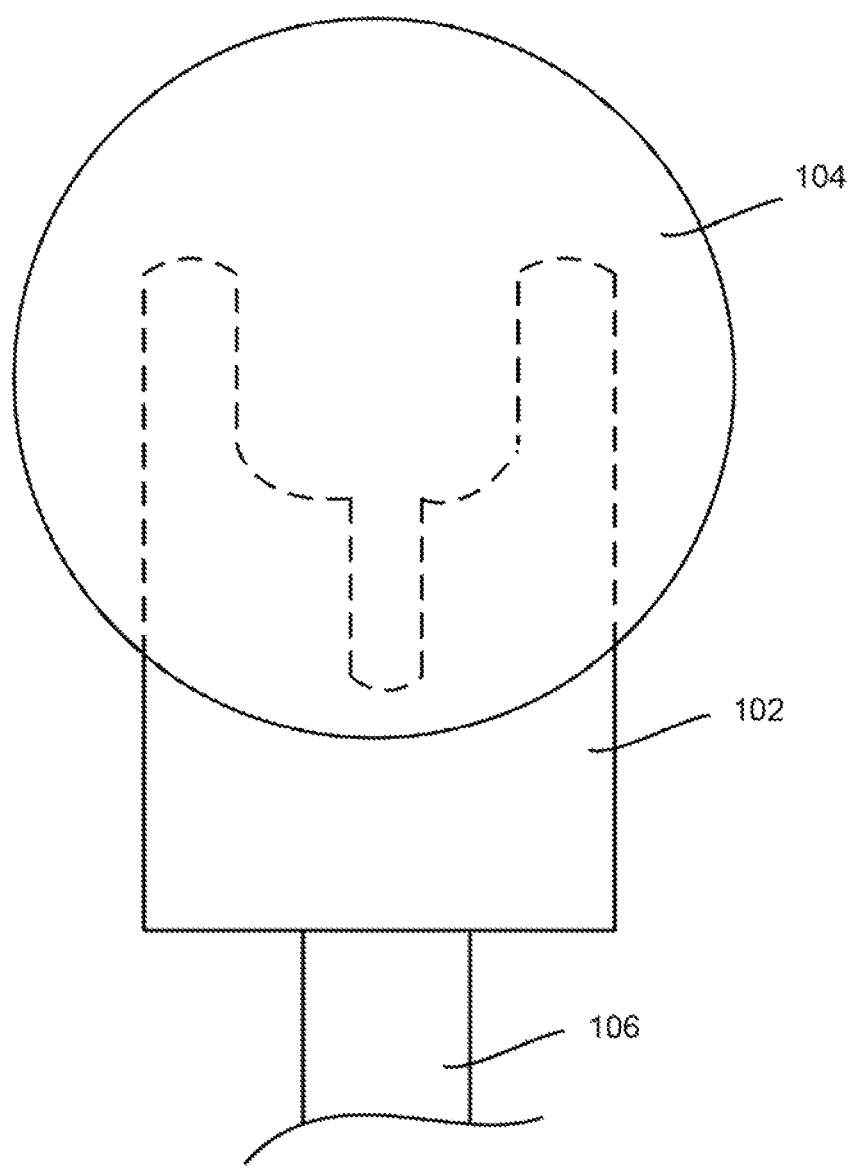
FIG. 1 shows a representative prior art end effector for supporting a wafer during wafer transfer.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for creating a DA beam calibrating assembly for the purpose of calibrating the DA (dynamic alignment) beams. In an embodiment, the wafer-centering requirement (of the calibration wafer relative to the end effector) of the DA beam calibrating assembly is simulated using the robot arm movement to compensate for an incorrectly centered calibration wafer on the end effector. An optical wafer-centering method is employed to determine the amount of correction required by the robot arm to compensate for the incorrect end effector/wafer alignment. By compensating for the incorrect end effector/wafer alignment using robot arm movement, the effect of a correctly centered wafer on an end effector is achieved through simulation.

Once the robot arm has moved by a requisite amount to compensate for the incorrect end effector/wafer alignment (using compensation data acquired through the aforementioned optical wafer-centering method), the resultant DA beam calibrating assembly may be moved through the DA beams to obtain the desired reference DA beam pattern. Advantageously, embodiments of the invention achieve DA beam calibration without the need of a mechanical fixture (e.g., wafer-simulating disk) or suffering the disadvantages associated with the prior art DA beam calibration approach.

In one or more embodiments of the invention, an optical wafer-centering technique is employed to determine the location of the calibration wafer (i.e., the wafer employed for DA beam calibration) relative to the end effector-defined center.

Note that the calibration wafer may represent any wafer or wafer blank that is substantially similar to the wafers used in production. This optical wafer-centering process produces data that enables the robot controller to move the robot arm by a requisite amount to adjust for any offset between the calibration wafer center and the end effector center.

In one or more embodiments of the invention, at least a still image is taken of at least a portion of the calibration wafer and at least a portion of the end effector when the calibration wafer is disposed on the end effector. The end effector is provided with one ore more visual indicators that enable a processing unit to determine, from the still image taken, the end effector-defined center. In one or more embodiments of the invention, the end effector is provided with a scribe line (or any reference mark that forms an arc of a circle). The scribe line is positioned on the end effector such that a still image may be taken of the scribe line even if a wafer is disposed on the end effector. The scribe line on the end effector is configured, in an embodiment, to be an arc of a circle, the center of which coincides with the end effector-defined center. By ascertaining the arc and the center of the circle of which the scribe line is a part of, the end effector-defined center may be determined.

The wafer similarly has one ore more visual features (such as the generally circular outline of the wafer periphery) to enable the processing unit to determine the center of the wafer. As in the case with the end effector, one or more visual indicators may alternatively or additionally be provided for the calibration wafer to allow the processing unit to more efficiently ascertain the center of the wafer. In a preferred embodiment, however, the outer periphery of the wafer itself constitutes such a desired visual indicator. Once the wafer center and the end effector center are determined by the processing unit, the offset (i.e., the "delta") between these two centers are computed.

Generally speaking there are at least two techniques to correct a wafer/end effector misalignment. The first technique is physical correction. Physical correction is accomplished by moving the end effector and wafer to a holding station. The wafer is then placed on the holding station and then the robot arm moves the end effector by a distance "delta" to correct for the offset found by the optical wafer-centering method. The end effector then picks up the wafer again for optical analysis. In effect, a physical repositioning the wafer on the end effector is performed. The process may be performed iteratively until the wafer is found to have centered satisfactorily on the end effector.

The second technique to correct a wafer/end effector misalignment is to move the robot arm, which effectively moves the end effector and wafer assembly, by the error correction vector based on data determined by the optical wafer-centering process. This movement simulates, to the DA beams, the wafer position that the calibration wafer would have occupied had the calibration wafer been correctly centered on the end effector. After such correction, the end effector/wafer assembly may be moved through the DA beams (preferably in a straight line) to acquire the desired reference DA beams.

The features and advantages of the invention may be better understood with reference to the figures and discussions that follow.

Figure 2:
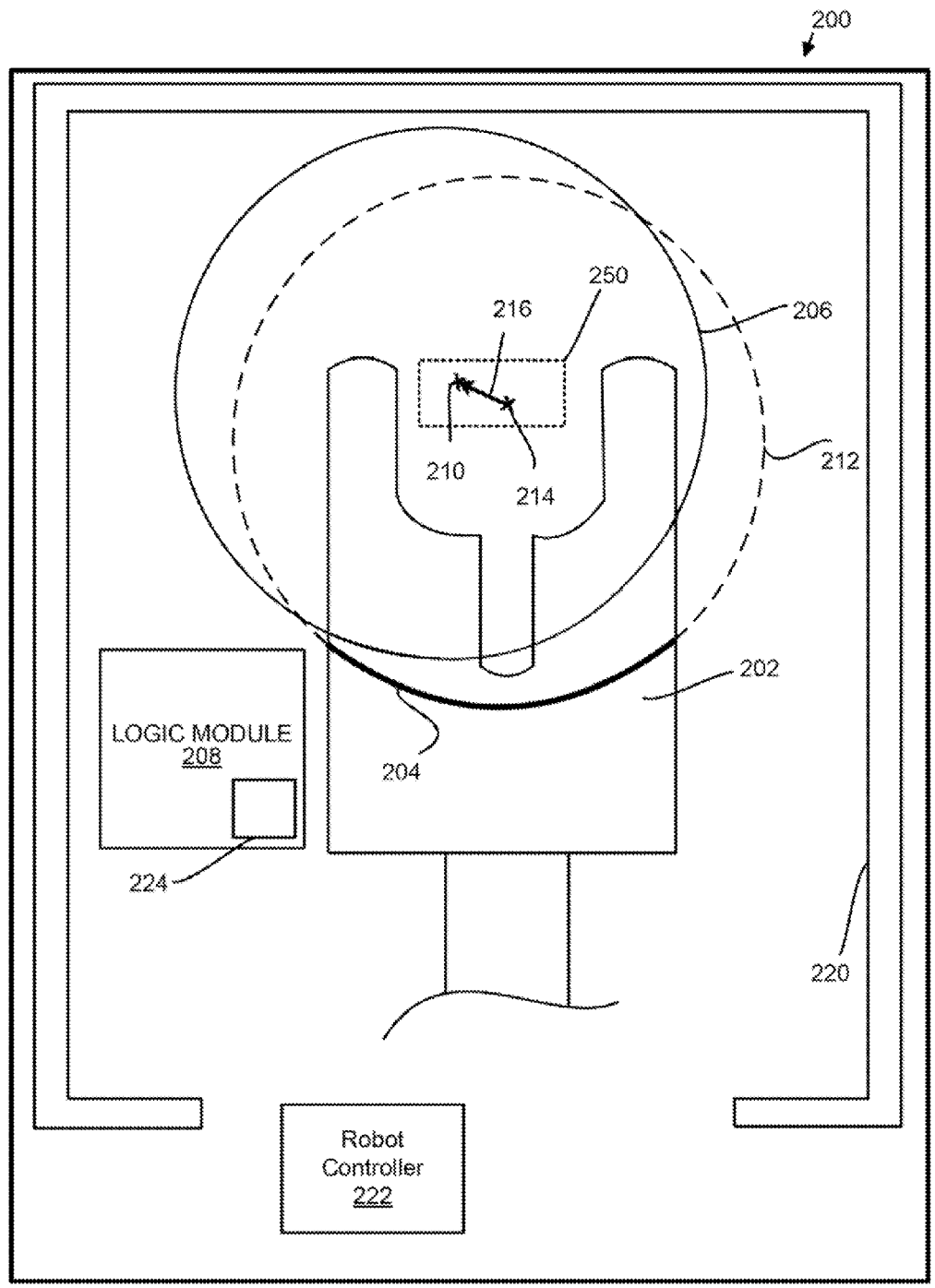
FIG. 2 shows, in accordance with an embodiment of the present invention, schematic representation of a plasma processing system illustrating a top view of at least a portion of an optical wafer-centering system for enabling the creation or simulation of a correctly centered wafer/end effector assembly for DA beam calibration purposes.

FIG. 2 shows, in accordance with an embodiment of the present invention, a schematic representation of a plasma processing system 220 illustrating a top view of at least a portion of an optical wafer-centering system for enabling the creation or simulation of a correctly centered wafer/end effector assembly for DA beam calibration purposes. As seen in FIG. 2, the optical wafer-centering system includes an end effector 202 having thereon a scribe mark 204. The scribe mark 204, in the example of FIG. 2, is an arc representing a portion of a circle, the center of which coincides with the end effector-defined center.

FIG. 2 also shows a wafer 206, representing the calibrating wafer to be employed to create the reference DA beam pattern. The optical wafer-centering system is configured to determine, using an optical method, the center of the wafer and the end effector-defined center in order to perform actual centering of the wafer on the end effector or to simulate a correctly centered wafer on the end effector for DA beam calibration purposes.

During optical wafer centering, an image acquisition device 250 (e.g., a camera disposed above end effector 202 and wafer 206) may take at least a still image of end effector 202, including scribe mark 204, and of wafer 206. Note that a portion of end effector 202 may be hidden under wafer 206 if the still image is taken from overhead from a camera and/or lens arrangement. Irrespective, it is important that some or all of scribe mark 204 be captured in the still image.

A processing unit 224 (for example, included in logic module 208) may be able to reconstruct the circle that is formed by the circular periphery of wafer 206 as well as to determine the center of that circle (which represents the center 210 of wafer 206). Likewise, processing unit 224 (for example, included in logic module 208) may be able to reconstruct the circle of which scribe line 204 is a part of as well as to determine the center of that circle. This circle is represented in FIG. 2 by dashed circle 212.

FIG. 2 also shows an end effector center 214, representing the end effector-defined center 202 as determined by the aforementioned processing unit. The delta 216 (i.e. the calculated difference from wafer center 210 to end effector center 214) is then generated. This delta 216, representing the correction factor employed by the robot arm to move the calibration wafer from its current position (which is incorrectly centered relative to the end effector) to the position that the correctly centered calibration wafer would have occupied.

In other words, once this correction is made by the robot arm, the wafer disposed on the end effector will appear to the DA beams in the same way that a wafer correctly centered on the end effector would appear. By recording the break-and-make patterns of the DA beams, a reference DA beam pattern may be obtained. As discussed, this reference DA beam pattern may be used during production to compare against the production DA beam pattern (i.e., the DA beam pattern made with a production wafer) to determine the amount of robot arm correction required for that production wafer during production.

Alternatively, as discussed earlier, the robot arm may move the calibration wafer to a holding station or holding jig. Once the calibration wafer is deposited on the holding station or holding jig, the robot arm may move the end effector by the positional correction vector (obtained during the optical wafer-centering process) to reposition the end effector relative to the calibration wafer. The process of imaging, analyzing for offsets, and repositioning the wafer on the end effector may be performed iteratively until the wafer is centered on the end effector satisfactorily. The resultant calibration fixture (i.e., a correctly centered wafer on the end effector) is then employed to obtain the reference DA beam pattern in the manner discussed earlier.

In an embodiment, the optical wafer-centering system may be performed in-situ (e.g., using a camera and/or lens arrangement that can obtain a still image while the wafer and the end effector are disposed inside the processing module). In the same or in an alternate embodiment, the processing module is placed under conditions that substantially approximate the production conditions. Although not absolutely necessary, in-situ optical wafer centering and/or in-situ DA beam calibration advantageously allows centering and/or calibration to be performed in conditions substantially similar to the production conditions, thereby reducing centering-related errors and/or calibration-related errors.

Once the still image is taken in-situ, the assembly that includes the calibration wafer and the end effector is removed from the processing module. Any desired correction may then be made to account for the end effector/wafer mis-alignment. After the correction is made, the assembly that includes the calibration wafer and the end effector is introduced into the processing module again through the DA beams to produce the desired reference DA beam pattern.

In another embodiment, the optical wafer-centering technique may be performed outside of the processing module. Once the still image is taken and analyzed and any necessary correction is made, the calibration assembly that includes the calibration wafer and the end effector is introduced into the processing module again through the DA beams to produce the desired DA beam pattern.

Figure 3:
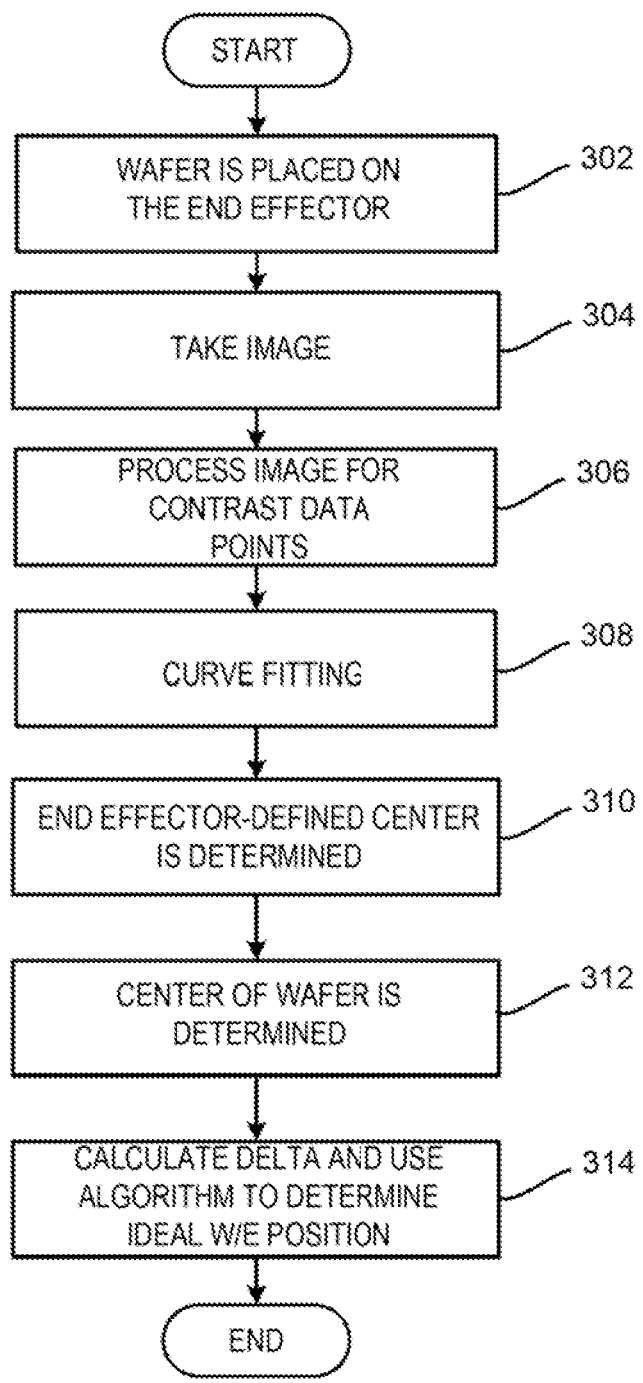
FIG. 3 shows, in accordance with an embodiment of the present invention, a illustrative flow chart of the steps for creating or simulating a centered wafer relative to the end effector-defined center using an optical wafer-centering technique in order to facilitate DA beam calibration.

FIG. 3 shows, in accordance with an embodiment of the present invention, a illustrative flow chart of the steps for creating or simulating a centered wafer relative to the end effector-defined center using an optical wafer-centering technique in order to facilitate DA beam calibration. The method may be performed by, for example, utilizing one or more of the components discussed with reference to the example of FIG. 2. In step 302, a wafer is placed on the end effector such that a still image, including one or more visual indicators on the end effector and one or more visual indicator of the wafer can be taken.

In step 304, a still image is taken of the end effector, the one ore more visual indicators on the end effector, and the wafer in the manner discussed in connection with FIG. 2.

In step 306, image processing is undertaken to determine the one or more visual indicator on the end effector (e.g., the aforementioned scribe line) and to determine the circle that is formed by the outer periphery of the wafer. In an embodiment, the still image is analyzed for contrast. To assist a processing unit, the camera and/or lens may be configured such that the light frequency, the lighting condition, the aperture, the focus, the field-of-view, etc., are optimal for determining the contrast and to allow the processing unit to acquire the visual indicators that provide data to determine the end effector center and the wafer center. One in art would readily appreciate from the foregoing that the control of these parameters and conditions, as well as other image-related parameters, may be undertaken to improve the contrast in the image and/or render image processing more accurate.

In an embodiment, step 308 involves generating a plurality of data points along contrasting pixels in the still image and performing curve fitting to re-create the desired circle. Such image processing techniques and curve fitting techniques are well-known to those skilled in the art in other fields and can be accomplished using many generic off-the-shelf processing unit packages (such as for example the Keyence communication software for use with CV-3002 Series Controller CV-H3N, available from Keyence Corporation of Woodcliff Lake, N.J.).

In step 310, the end effector-defined center is ascertained from the circle recreated by the processing unit from the end effector visual indicator (e.g., the scribe line).

In step 312, the center of the wafer is ascertained from the circle recreated by the processing unit from the wafer visual indicator (e.g., the outer periphery of the wafer).

In step 314, the difference between the two centers (i.e. the calculated difference from wafer center to end effector center) is then generated. For example, in an embodiment, the DA beam patterns are employed to reconstruct the two circles representing the two wafers (e.g.; the production wafer and the calibration wafer) in order to ascertain their centers (and the difference between the wafer centers). An algorithm is then employed in order to determine the positional correction vector required to move the robot arm to allow the wafer that is incorrectly centered with respect to the end effector to appear to the DA beams as if that wafer is corrected centered with respect to the end effector.

In step 316, this error vector is provided to the robot controller to allow the robot controller to perform the compensation. Once the end effector/wafer mis-alignment is compensated for, the calibration fixture that includes the calibrating wafer and the end effector is moved through the DA beams, preferably in a straight-line manner, to obtain the aforementioned reference DA beam pattern.

As can be appreciated from the foregoing, embodiments of the invention facilitate the acquisition of a reference DA beam pattern in a manner that is free of the disadvantages associated with the prior art mechanical fixture approach. Furthermore, the elimination of the need to use an especially constructed disk for simulating a correctly centered wafer eliminates the introduction of unfamiliar hardware into the plasma processing module, thereby reducing the possibility of calibration-related end effector damage and calibration-related particle contamination.

While this invention has been described in terms of several preferred embodiments, there are alterations, permutations, and equivalents, which fall within the scope of this invention. Although various examples are provided herein, it is intended that these examples be illustrative and not limiting with respect to the invention. For example, although the visual indicator of the example herein is an arc, any other visual marking capable of enabling the processing unit to produce the end effector center and/or the wafer center may be employed.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for performing DA (Dynamic Alignment) beam calibration in a plasma processing system, said method comprising:
   acquiring a positional difference between a wafer and an end effector, said positional difference is acquired using an optical imaging approach, said optical imaging approach comprising:
   positioning the wafer on the end effector of a robot arm,
   taking a still image of said wafer on said end effector with an image acquisition device,
   determining a center of said wafer and said end effector-defined center of said end effector by processing said still image with a processing unit, determining said positional difference between said center of said wafer and said end effector-defined center with the processing unit, centering said wafer with respect to said end effector by compensating for said positional difference between said center of said wafer and said end effector-defined center with robot movement compensation of the robot arm, moving said wafer and said end effector through DA beams associated with a plasma processing module; and obtaining a reference DA beam pattern with the processing unit by recording a break-and-make pattern of said DA beams, said break-and-make pattern occurring as said wafer and said end effector move through said DA beams, wherein a single visual indicator is located on said end effector, said visual indicator representing a reference mark, said processing unit deriving said end effector-defined center by using the reference mark; wherein said still image includes both said visual indicator and a portion of said wafer, wherein said visual indicator is a scribe line, said scribe line configured to be an arc of a circle such that the center of said circle coincides with said end effector-defined center.

2. The method of claim 1 further comprising determining said center of said wafer by providing a first visual indicator on said wafer for enabling the processing unit to determine from said still image said center of said wafer, said first visual indicator employed to ascertain the circle that is described by said first visual indicator.

3. The method of claim 1 further comprising taking said still image of said wafer and said end effector during production conditions with the image acquisition device such that said DA beams are calibrated in said production conditions.

4. The method of claim 3 further comprising taking said still image of said wafer and said end effector while said wafer and said end effector are located inside a plasma processing chamber.

5. The method of claim 1 further comprising determining said center of said wafer by providing a first visual indicator on said wafer for enabling the processing unit to determine from said still image said center of said wafer wherein said first visual indicator of said wafer is at least a portion of said periphery of said wafer.

6. The method of claim 1 further comprising acquiring said still image through an optical access.

7. A method for performing DA (Dynamic Alignment) beam calibration in a plasma processing system, said method comprising:

acquiring a positional difference between a wafer and an end effector, said positional difference is acquired using an optical imaging approach, said optical imaging approach comprising:

positioning the wafer on the end effector of a robot arm, taking a still image of said wafer on said end effector with an image acquisition device, determining a center of said wafer and said end effector-defined center of said end effector by processing said still image with a processing unit, determining said positional difference between said center of said wafer and said end effector-defined center with the processing unit, centering said wafer with respect to said end effector by repositioning said wafer on said end effector to correct for said positional difference, moving said wafer and said end effector through DA beams associated with a plasma processing module; and obtaining a reference DA beam pattern with the processing unit by recording a break-and-make pattern of said DA beams, said break-and-make pattern occurring as said wafer and said end effector move through said DA beams, wherein a single visual indicator is located on said end effector, said visual indicator representing a reference mark, said processing unit deriving said end effector-defined center by using the reference mark; wherein said still image includes both said visual indicator and a portion of said wafer, wherein said visual indicator is a scribe line, said scribe line configured to be an arc of a circle such that the center of said circle coincides with said end effector-defined center.

8. The method of claim 7 further comprising determining said center of said wafer by providing a first visual indicator on said wafer for enabling the processing unit to determine from said still image said center of said wafer, said first visual indicator employed to ascertain the circle that is described by said first visual indicator.

9. The method of claim 7 further comprising taking said still image of said wafer and said end effector during production conditions with the image acquisition device such that said DA beams are calibrated in said production conditions.

10. The method of claim 9 further comprising taking said still image of said wafer and said end effector while said wafer and said end effector are located inside a plasma processing chamber.

11. The method of claim 7 further comprising determining said center of said wafer by providing a first visual indicator on said wafer for enabling the processing unit to determine from said still image said center of said wafer wherein said first visual indicator of said wafer is at least a portion of said periphery of said wafer.

12. The method of claim 7 further comprising acquiring said still image through an optical access.

* * * * *